US012625099B2

(12) United States Patent
Kim et al.

(10) Patent No.: US 12,625,099 B2
(45) Date of Patent: May 12, 2026

(54) METHOD FOR CHARACTERIZING ENERGY LEVEL OF CORE/SHELL NANOPARTICLE

(71) Applicant: KOREA RESEARCH INSTITUTE OF STANDARDS AND SCIENCE, Daejeon (KR)

(72) Inventors: Jeong Won Kim, Daejeon (KR); Jiyoung Yoon, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 1007 days.

(21) Appl. No.: 17/726,382

(22) Filed: Apr. 21, 2022

(65) Prior Publication Data

US 2022/0244203 A1 Aug. 4, 2022

Related U.S. Application Data

(63) Continuation of application No. PCT/KR2020/018298, filed on Dec. 15, 2020.

(30) Foreign Application Priority Data

Jan. 29, 2020 (KR) ........................ 10-2020-0010502

(51) Int. Cl.
*G01N 23/2273* (2018.01)
*H01S 5/00* (2006.01)
*H01S 5/34* (2006.01)

(52) U.S. Cl.
CPC ....... *G01N 23/2273* (2013.01); *H01S 5/0014* (2013.01); *G01N 2223/085* (2013.01); *G01N 2223/1016* (2013.01); *H01S 5/341* (2013.01)

(58) Field of Classification Search
CPC ... H01S 5/0014; H01S 5/341; G01N 23/2273; G01N 2223/1016; G01N 2223/085
See application file for complete search history.

(56) References Cited

U.S. PATENT DOCUMENTS

| | | | | |
|---|---|---|---|---|
| 5,670,789 A | * | 9/1997 | Iwata | H10H 20/812 |
| | | | | 257/E33.005 |
| 10,828,622 B2 | * | 11/2020 | Sowwan | B01J 35/70 |
| 11,222,997 B2 | | 1/2022 | Kim et al. | |
| 2003/0010987 A1 | * | 1/2003 | Banin | H01S 5/341 |
| | | | | 257/82 |

(Continued)

FOREIGN PATENT DOCUMENTS

| | | |
|---|---|---|
| KR | 20170028306 A | 3/2017 |
| KR | 20190043085 A | 4/2019 |

OTHER PUBLICATIONS

Lianwei Shan et al.; "An α-Bi2O3/BiOBr Core-Shell Heterojunction With High Photocatalytic Activity"; Dalton Trans., 2017, 46, 2310-2321; The Royal Society of Chemistry.

(Continued)

*Primary Examiner* — M. A. Golub-Miller
(74) *Attorney, Agent, or Firm* — Central California IP Group, P.C.; Andrew D. Fortney

(57) ABSTRACT

In a method for determining an energy level of a core/shell according to an example, a valence band energy level of a shell and a core-level energy level of a core in a core/shell nanoparticle are measured together, and by using a valence band energy level and a core-level of a core nanoparticle including only a core, a reliable energy level in a core/shell structure may be determined.

8 Claims, 7 Drawing Sheets

(56)             References Cited

U.S. PATENT DOCUMENTS

| | | | |
|---|---|---|---|
| 2007/0295266 A1* | 12/2007 | Lee | H01L 21/0256 |
| | | | 117/53 |
| 2015/0185149 A1* | 7/2015 | Jin | C40B 70/00 |
| | | | 250/200 |
| 2017/0271604 A1 | 9/2017 | Brown et al. | |
| 2019/0097101 A1* | 3/2019 | Dorman | C09K 11/025 |
| 2019/0115507 A1 | 4/2019 | Kim et al. | |
| 2020/0299576 A1* | 9/2020 | Lim | C09K 11/892 |
| 2021/0109042 A1* | 4/2021 | Liu | G01N 23/223 |
| 2021/0229169 A1* | 7/2021 | Wang | B22F 1/054 |
| 2022/0003691 A1* | 1/2022 | Soejima | G01N 23/223 |
| 2022/0082515 A1* | 3/2022 | Yun | G01N 23/2273 |
| 2022/0267672 A1* | 8/2022 | Yeh | C09K 11/883 |
| 2022/0373486 A1* | 11/2022 | Lincoln | G01N 23/2273 |
| 2023/0288337 A1* | 9/2023 | Jin | C09K 11/7773 |

OTHER PUBLICATIONS

Kai Huang et al.; "Internal Structure of InP/ZnS Nanocrystals Unraveled by High-Resolution Soft X-ray Photoelectron Spectroscopy"; ACS Nano; 2010, vol. 4 No. 8, 4799-4805; American Chemical Society.

Dong Li et al.; "Enhanced Efficiency of InP-Based Red Quantum Dot Light-Emitting Diodes"; ACS Appl. Mater. Interfaces; 2019, vol. 11, No. 37, p. A-I; ACS Publications.

International Search Report dated Mar. 11, 2021; International Application No. PCT/KR2020/018298; ISA/KR; Korean Intellectual Property Office, Daejeon, Korea.

* cited by examiner

FIG. 3

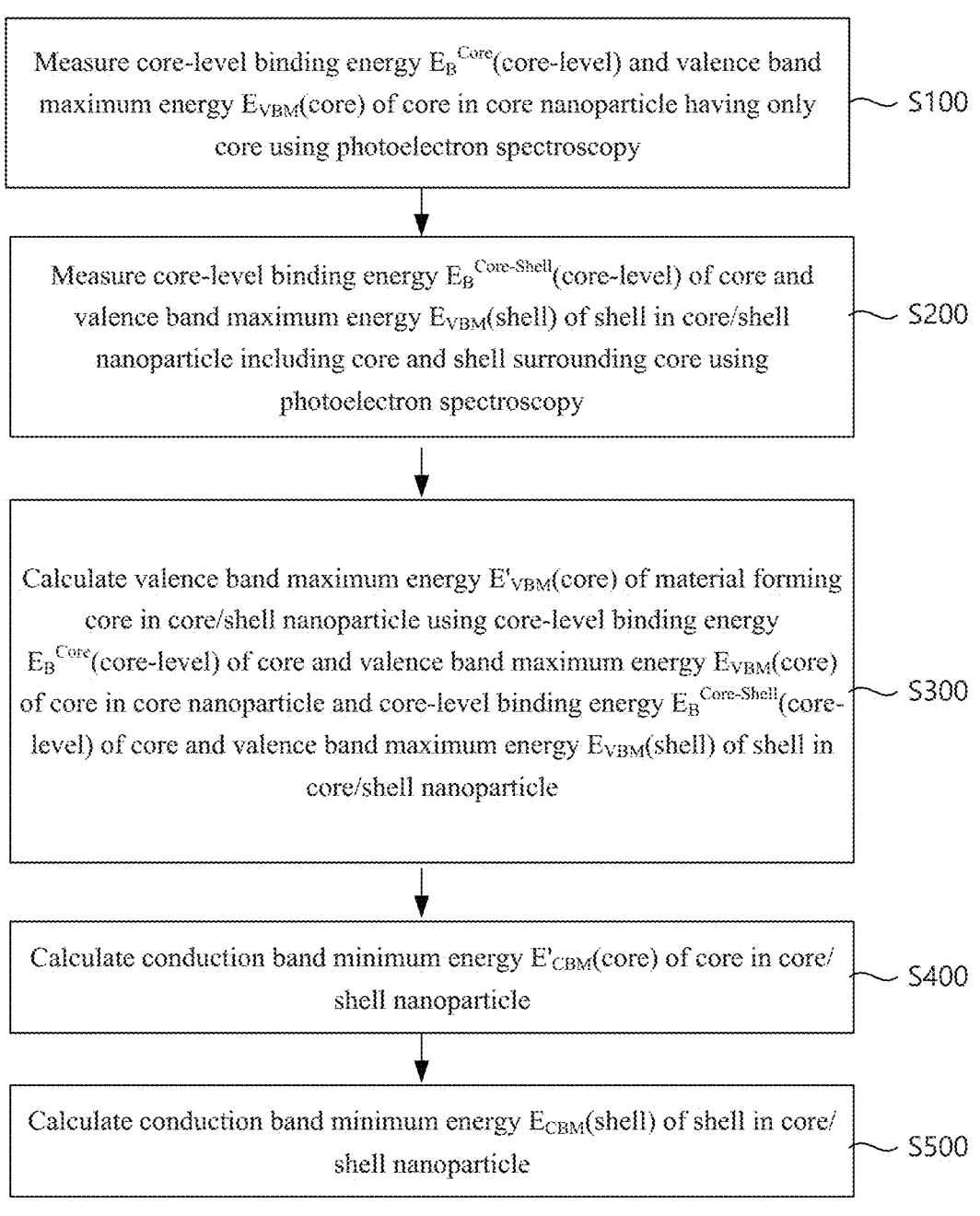

Measure core-level binding energy $E_B^{Core}$(core-level) and valence band maximum energy $E_{VBM}$(core) of core in core nanoparticle having only core using photoelectron spectroscopy ~ S100

Measure core-level binding energy $E_B^{Core-Shell}$(core-level) of core and valence band maximum energy $E_{VBM}$(shell) of shell in core/shell nanoparticle including core and shell surrounding core using photoelectron spectroscopy ~ S200

Calculate valence band maximum energy $E'_{VBM}$(core) of material forming core in core/shell nanoparticle using core-level binding energy $E_B^{Core}$(core-level) of core and valence band maximum energy $E_{VBM}$(core) of core in core nanoparticle and core-level binding energy $E_B^{Core-Shell}$(core-level) of core and valence band maximum energy $E_{VBM}$(shell) of shell in core/shell nanoparticle ~ S300

Calculate conduction band minimum energy $E'_{CBM}$(core) of core in core/shell nanoparticle ~ S400

Calculate conduction band minimum energy $E_{CBM}$(shell) of shell in core/shell nanoparticle ~ S500

$$E_{VBM}(core) = E_{VBM}(core) + E_B^{Core-Shell}(3d_{5/2}) - E_B^{Core}(3d_{5/2})$$

$E_{VBM}$ (core) = 1.65 eV $E_{VBM}$ (shell) = 2.05 eV 443.85 eV

VBM spectra of ZnSe Shell
UV photoelectron
Spectroscopy

Binding Energy [eV]

Electron Counts

Core/Shell (InP/ZnSe)

$E_B^{core-shell}$ (In 3d$_{5/2}$) = 445.5 eV

In 3d$_{5/2}$ core-level spectra
X-ray photoelectron
Spectroscopy

Binding Energy [eV]

Electron Counts

METHOD FOR CHARACTERIZING ENERGY LEVEL OF CORE/SHELL NANOPARTICLE

CROSS-REFERENCE TO RELATED APPLICATIONS

This application is a continuation of and claims priority to PCT/KR2020/018298 filed on Dec. 15, 2020, which claims priority to Korea Patent Application No. KR 10-2020-0010502 filed on Jan. 29, 2020, the entireties of which are both hereby incorporated by reference.

TECHNICAL FIELD

The present disclosure relates to a method for characterizing an energy level of a nanoparticle having a core/shell structure and, more particularly, to a method for characterizing an energy level of a nanoparticle having a core/shell structure using photoelectron spectroscopy.

BACKGROUND

Even when materials are the same, a band gap and an energy level may be changed depending on a diameter of a core and a thickness of a shell in a core/shell nanostructure due to a quantum confinement effect.

A core/shell semiconductor nanostructure has characteristics in which an energy level is changed, as compared with a structure having only a core. For example, a conduction band energy level and a valence band energy level of core nanoparticles having only a core are not the same as a conduction band energy level and a valence band energy level of a core in a core/shell structure.

In nanoparticles having a core/shell structure, a conduction band energy level and a valence band energy level of a core and a conduction band energy level and a valence band energy level of a shell are required to be precisely measured.

SUMMARY

An aspect of the present disclosure is to provide a method for determining an energy level of nanoparticles having a core/shell structure using photoelectron spectroscopy. A valence band energy level and a conduction band energy level of a core and a valence band energy level and a conduction band energy level of a shell may determine physical and chemical properties of nanoparticles having a core/shell structure.

A core/shell nanoparticle according to an example embodiment includes a core and a shell surrounding the core. A method for characterizing an energy level of the core/shell nanoparticle includes: measuring core-level binding energy $E_B{}^{Core}$(core-level) and valence band maximum energy $E_{VBM}$(core) of a core in a core nanoparticle having only the core using photoelectron spectroscopy; measuring core-level binding energy $E_B{}^{Core-Shell}$(core-level) of the core and valence band maximum energy $E_{VBM}$(shell) of the shell in the core/shell nanoparticle including the core and a shell surrounding the core using photoelectron spectroscopy; and calculating valence band maximum energy $E'_{VBM}$(core) of a material forming the core in the core/shell nanoparticle using the core-level binding energy $E_B{}^{Core}$(core-level) of the core and the valence band maximum energy $E_{VBM}$(core) of the core in the core nanoparticle and the core-level binding energy $E_B{}^{Core-Shell}$(core-level) of the core and the valence band maximum energy $E_{VBM}$(shell) of the shell in the core/shell nanoparticle.

In an example embodiment, the core may be InP, the shell may be ZnSe, and the core-level may be $3d_{5/2}$ of In.

In an example embodiment, the valence band maximum $E'_{VBM}$(core) in the core/shell nanoparticle is given as follows:

$$E'_{VBM}(\text{core}) = E_{VBM}(\text{core}) + E_B^{Core-Shell}(\text{core-level}) - E_B^{Core}(\text{core-level})$$

in an example embodiment, the method may further include calculating a conduction band minimum energy $E'_{CBM}$(core) of the core in the core/shell nanoparticle. A core energy bandgap BG(core) in the core/shell nanoparticle may be measured using photoluminescence spectroscopy. The core energy bandgap BG(core) may be a difference between the conduction band minimum energy $E'_{CBM}$(core) of the core and valence band maximum energy $E'_{VBM}$(core) in the core/shell nanoparticle. Accordingly, the conduction band minimum energy $E'_{CBM}$(core) of the core in the core/shell nanoparticle may be given as follows:

$$E'_{CBM}(\text{core}) = E'_{VBM}(\text{core}) + BG(\text{core})$$

In an example embodiment, the method may further include calculating conduction band minimum energy $E_{CBM}$(shell) of the shell in the core/shell nanoparticle. The conduction band minimum energy $E_{CBM}$(shell) of the shell may be given as follows: $E_{CBM}$(shell)=$E_{VBM}$(hell)+BG(shell), and a shell energy bandgap BG(shell), which is a difference between the conduction band minimum energy $E_{CBM}$(shell) and the valence band maximum energy $E_{VBM}$(shell) of the shell in the core/shell nanoparticle, may be a value measured in a bulk state.

In an example embodiment, core-level binding energies $E_B{}^{Core}$ (core) and $E_B{}^{Core-Shell}$ (core-level) may be measured using X-ray, and valence band maximum energies $E_{VBM}$ (core) and $E_{VBM}$(Shell) may be measured using ultraviolet (UV) light or X-ray.

BRIEF DESCRIPTION OF DRAWINGS

The above and other aspects, features, and advantages of the present disclosure will be more clearly understood from the following detailed description, taken in conjunction with the accompanying drawings.

FIG. 3 is a flowchart illustrating a method of characterizing an energy level of core/shell nanoparticles according to the present disclosure.

DETAILED DESCRIPTION

Core/shell nanoparticles are nanometer-sized materials and exhibit better photoelectric properties than conventional bulk and thin film materials.

In the core/shell nanoparticles, a core determines an emission wavelength, and a shell chemically protects the core and determines movement paths and injection efficiency of electrons and holes.

In core/shell nanoparticles, a valence hared energy level and a conduction hand energy level vary depending on a size of the core, a thickness of the shell, and a change in composition of an interface between the core and the shell.

In the case of a light emitting device, electrons and holes are collected on an energy level of a core and are recombined to emit light. When the core and the shell have an optimal energy level, a light emitting device having high efficiency may be manufactured.

Accordingly, to manufacture a light emitting device with high efficiency, there is a requirement to accurately measure each energy level at an interface between a core and a shell of semiconductor nanoparticles having a core/shell structure.

According to an example embodiment, an energy level in each of the core and the shell of the semiconductor nanoparticles having the core/shell structure may be measured using photoelectron spectroscopy. Accordingly, an optimal method of synthesizing semiconductor nanoparticles having a core/shell structure may be proposed based on the measured energy level.

By using a method of determining an energy level of the core/shell according to an example embodiment, a valence band energy level of a shell and a core-level of a core may be measured together in nanoparticles of a core/shell structure, and when a valence hand energy level and a core-level of core nanoparticles having only a core is used, a reliable energy level may be determined in the core/shell structure.

Hereinafter, embodiments of the present disclosure will be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
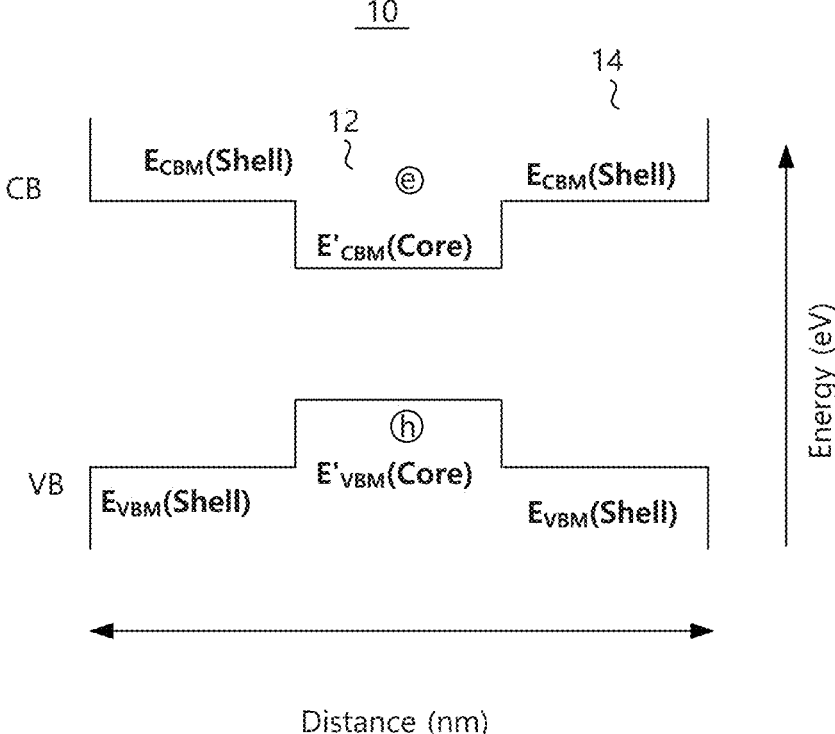
FIG. 1 is a diagram illustrating a band diagram of a core/shell nanoparticle according to an example embodiment of the present disclosure.

FIG. 1 is a diagram illustrating a band diagram of a core/shell nanoparticle according to an example embodiment of the present disclosure.

Referring to FIG. 1, the core/shell nanoparticle includes a core and a shell surrounding the core. For example, a bandgap of the core may be smaller than a bandgap of the shell. In addition, an energy level of the core/shell nanoparticles may change optical properties. The core may have a valence band maximum energy $E'_{VBM}(\text{core})$ and a conduction band minimum energy $E'_{CBM}(\text{core})$. The shell may have a valence band maximum energy $E_{VBM}(\text{shell})$ and a conduction band minimum energy $E_{CBM}(\text{shell})$. Each of the core and the shell has a crystal structure. A valence band VB) is separated from a conduction band CB by a bandgap.

An energy level of the core/shell nanoparticles may determine physical and chemical properties of the core/shell nanoparticles. Accordingly, there is a requirement to accurately measurement the energy level of the core/shell nanoparticles.

The core/shell nanoparticle includes a core and a shell surrounding the core. In the core/shell nanoparticle, the core and the shell are crystalline and may be semiconductors. The core may be a first semiconductor, and the shell may be a second semiconductor. For example, the core/shell nanoparticles may have an InP/ZnSe structure. For example, the first semiconductor may be InP, and the second semiconductor may be ZnSe. The first semiconductor and the second semiconductor may be II-VI, IV-VI, or III-V semiconductors. The first semiconductor and the second semiconductor may be different materials.

In the core/shell nanoparticle, when the core is InP, photoelectron spectroscopy may include a core-level peak of In atoms and a core-level peak of P atoms. A core-level of the core may be selected as a peak having highest intensity in photoelectron spectroscopy. For example, the core-level of the core may be a 3d orbital of In atoms. In greater detail, the core-level of the core may be may be a $3d_{5/2}$ orbital of In atoms. The core-level of the core may vary depending on a case in which an atom is present alone, a case of constituting only a core in a crystalline state, and a case of forming a core/shell structure.

Figure 2:
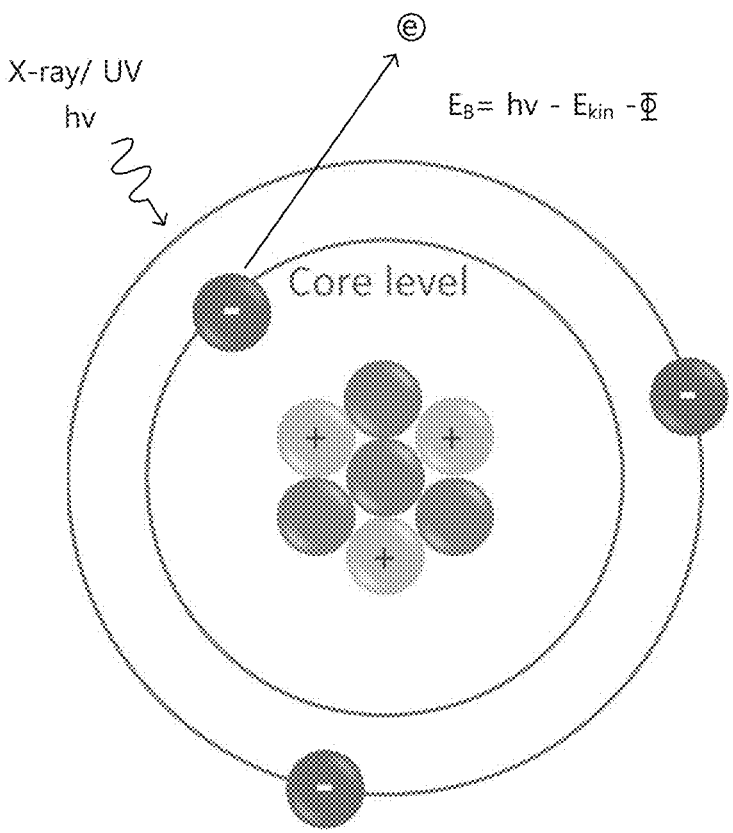
FIG. 2 is a conceptual diagram illustrating photoelectron spectroscopy of core/shell nanoparticles according to an example embodiment of the present disclosure.

FIG. 2 is a conceptual diagram illustrating photoelectron spectroscopy of core/shell nanoparticles according to an example embodiment of the present disclosure.

Referring to FIG. 2, X-ray or UV light is incident on a crystal sample. Binding energy is given by Equation 1.

$$E_B = hv - E_{kin} - \Phi \qquad \text{[Equation 1]}$$

where $E_B$ is the binding energy, hv is energy of an incident photon, $E_{kin}$ is energy of flying-out electron, and $\Phi$ is a work function of the crystal sample.

FIG. 3 is a flowchart illustrating a method of characterizing an energy level of a core/shell nanoparticle according to the present disclosure.

Referring to FIG. 3, a core/shell nanoparticle includes a core and a shell surrounding the core. A method for characterizing an energy level of a core/shell nanoparticle may include measuring core-level binding energy $E_B^{Core}(\text{core-level})$ and valence band maximum energy $E_{VBM}(\text{core})$ of a core in a core nanoparticle having only the core using photoelectron spectroscopy (S100), measuring core-level binding energy $E_B^{Core-Shell}(\text{core-level})$ of the core and valence band maximum energy $E_{VBM}(\text{shell})$ of the shell in the core/shell nanoparticle including the core and a shell surrounding the core using photoelectron spectroscopy (S200), and calculating valence band maximum energy $E'_{VBM}(\text{core})$ of a material forming the core in the core/shell nanoparticle using the core-level binding energy $E_B^{Core}(\text{core-level})$ of the core and the valence band maximum energy $E_{VBM}(\text{core})$ of the core in the core nanoparticle and the core-level binding energy $E_B^{Core-Shell}(\text{core-level})$ of the core and the valence band maximum energy $E_{VBM}(\text{shell})$ of the shell in the core/shell nanoparticle (S300).

When a valence band maximum of the core/shell nanoparticle is measured using photoelectron spectroscopy, electrons emitted from the valence band of the core may be incident on the shell and scattered to be attenuated. Meanwhile, electrons emitted from the valence band of the shell may be measured without being attenuated.

When a valence band maximum of the shell is measured, there may be an additional requirement to calculate a valence band maximum of the core, a conduction band minimum of the core, and a conduction band minimum of the shell in the core/shell nanoparticle.

To this end, a core nanoparticle including only a core may be prepared. The valence band maximum energy $E_{VBM}$(core) and the core-level binding energy $E_B^{core}$(core-level) of the core in the core nanoparticle may be measured by photoelectron spectroscopy (S100). A difference $E_B^{core}$(core level)–$E_{VBM}$(core) between core-level binding energy $E_B^{core}$ (core level) and the valence band maximum energy $E_{VBM}$ (core) may be invariant physical quantity which does not depend on the core/shell structure. The valence band maximum energy $E_{VBM}$(core) of the core may depend on an external environment such as a dielectric constant, while the difference $E_B^{core}$(core level)–$E_{VBM}$(core) may not depend on the external environment. The valence band maximum energy ($E_{VBM}$(core) of the core may be measured using X-ray or UV photoelectron spectroscopy, and the core-level binding energy of the core may be measured using X-ray photoelectron spectroscopy.

Core-level binding energy $E_B^{Core-Shell}$(core level) of the core and valence band maximum energy $E_{VBM}$(shell) of the shell in the core/shell nanoparticle including the core and the shell surrounding the core may be measured using photoelectron spectroscopy (S200). The core/shell nanoparticle includes a core and a shell surrounding the core. The photoelectron spectroscopy may not directly measure a valence band maximum of the core in the core/shell nanoparticle. However, photoelectron spectroscopy may measure the core-level binding energy $E_B^{Core}$(core level) of the core in the core/shell nanoparticle. Specifically, since electrons emitted from the core-level of the core in the core/shell nanoparticle have high intensity, so that the electrons may be measured even when the electrons are incident on the shell to be scattered and attenuated, in addition, when the valence band maximum of the core/shell nanoparticle is measured, electrons emitted from the valence band of the core may be incident on the shell to be scattered and attenuated, so that it may be difficult to measure to the electrons emitted from the valence band of the core. Meanwhile, electrons emitted from the valence band of the shell may be measured without being attenuated. X-rays may be used to observe a core level in crystal having high electron binding energy, and X-rays or UV may be used to observe a valence band used for bonding between atoms.

However, the valence band maximum energy $E'_{VBM}$(core) of the core in the core/shell nanoparticles may be calculated using the invariant of the core nanoparticles (S300). In the core/shell nanoparticle, the maximum valence electron energy $E'_{VBM}$(core) of the core is given as follows.

$$E'_{VBM}(\text{core}) = \qquad\qquad\qquad\qquad \text{[Equation 2]}$$
$$E_{VBM}(\text{core}) + E_B^{Core-Shell}(\text{core–level}) - E_B^{Core}(\text{core–level})$$

In addition, conduction band minimum energy $E'_{CBM}$ (core) of the core may be calculated using a core bandgap (BG(core)) measured using photoluminescence spectroscopy (S400). The core energy bandgap BG(core) is a difference between the conduction band minimum energy $E'_{CBM}$(core) of the core and the valence band maximum energy $E'_{VBM}$(core) of the core in the core/shell nanoparticles. In the core/shell nanoparticles, the conduction band minimum energy $E'_{CBM}$(core) of the core is given as follows.

$$E'_{CBM}(\text{core}) = E'_{VBM}(\text{core}) + BG(\text{core}) \qquad \text{[Equation 3]}$$

In the core/shell nanoparticle, valence band maximum energy $E_{VBM}$(shell) of the shell may be measured using photoelectron spectroscopy. In addition, a conduction band minimum of the shell may be calculated using a shell bandgap BG(shell) measured only with materials forming the shell. Conduction band minimum energy $E_{CBM}$(shell) of the shell may be given as follows.

$$E_{CBM}(\text{shell}) = E_{VBM}(\text{shell}) + BG(\text{shell}) \qquad \text{[Equation 4]}$$

In this case, the shell energy bandgap BG(shell) may be a value measured in a bulk state. The shell energy bandgap BG(shell) may be a difference between the conduction band minimum $E_{CBM}$(shell) and the valence band maximum energy $E_{VBM}$(shell) of the shell in the core/shell nanoparticle.

The valence band maximum energy $E_{VBM}$(core) of the shell depends on the external environment such as a dielectric constant, but the shell is exposed to air, so that the shell bandgap BG(shell) between the valence band maximum and the conduction band minimum of the shell may not depend on a core/shell structure and may have a constant value. The shell bandgap BG (shell) may be measured by measuring a bulk-type sample using a photoluminescence technique.

Accordingly, in the core/shell nanoparticle, both the valence band energy level and the conduction band energy level of the core and the valence band energy level and the conduction band energy level of the shell may be determined.

In conclusion, the valence band maximum of the core in the core/shell structure is determined using core-level binding energy shift $\Delta E_B$ in the nanoparticle including only a core and the core/shell nanoparticle.

Figure 4:
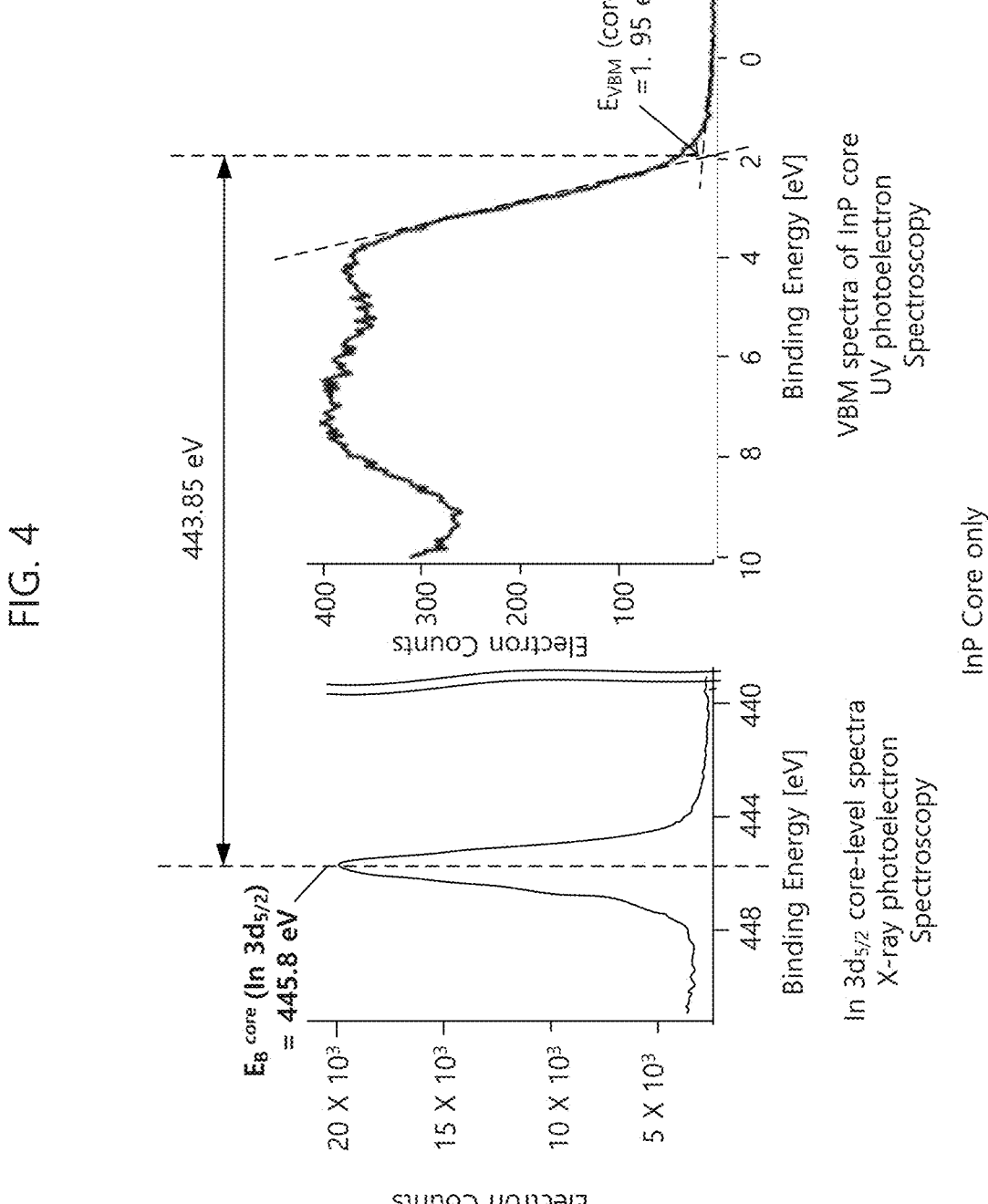
FIG. 4 is a diagram illustrating electron counts for binding energies in X-ray photoelectron spectroscopy and UV photoelectron spectroscopy of a core nanoparticle sample (InP).

FIG. 4 is a diagram illustrating electron counts for binding energies in X-ray, photoelectron spectroscopy and UV photoelectron spectroscopy of a core nanoparticle sample (InP).

Referring to FIG. 4, a core nanoparticle sample includes only InP, and core-level binding energy $E_B^{core}$(In $3d_{5/2}$) of a core was detected at 445.8 eV. The core-level binding energy $E_B^{core}$(In $3d_{5/2}$) was detected by X-ray photoelectron spectroscopy.

In addition, valence band maximum energy $E_{VBM}$(core) of the core was detected at 1.95 eV. The valence band maximum energy $E_{VBM}$(core) was detected by UV photoelectron spectroscopy. A difference between the core-level binding energy $E_B^{core}$(In $3d_{5/2}$) and the valence band maximum energy $E_{VBM}$(core) of the core was 443.85 eV, and this value was invariant.

Figure 5:
FIG. 5 is a diagram illustrating electron counts for binding energies in X-ray photoelectron spectroscopy and UV photoelectron spectroscopy of a core/shell nanoparticle sample (InP/ZnSe).

FIG. 5 is a diagram illustrating electron counts for binding energies in X-ray, photoelectron spectroscopy and UV photoelectron spectroscopy of a core/shell nanoparticle sample (InP/ZnSe).

Referring to FIG. 5, a core/shell nanoparticle includes an InP core and a ZnSe shell. Core-level binding energy $E_B^{core-shell}$(In $3d_{5/2}$) of the core was detected at 445.5 eV. The core-level binding energy $E_B^{core-shell}$(In $3d_{5/2}$) was detected by X-ray photoelectron spectroscopy.

Figure 6:
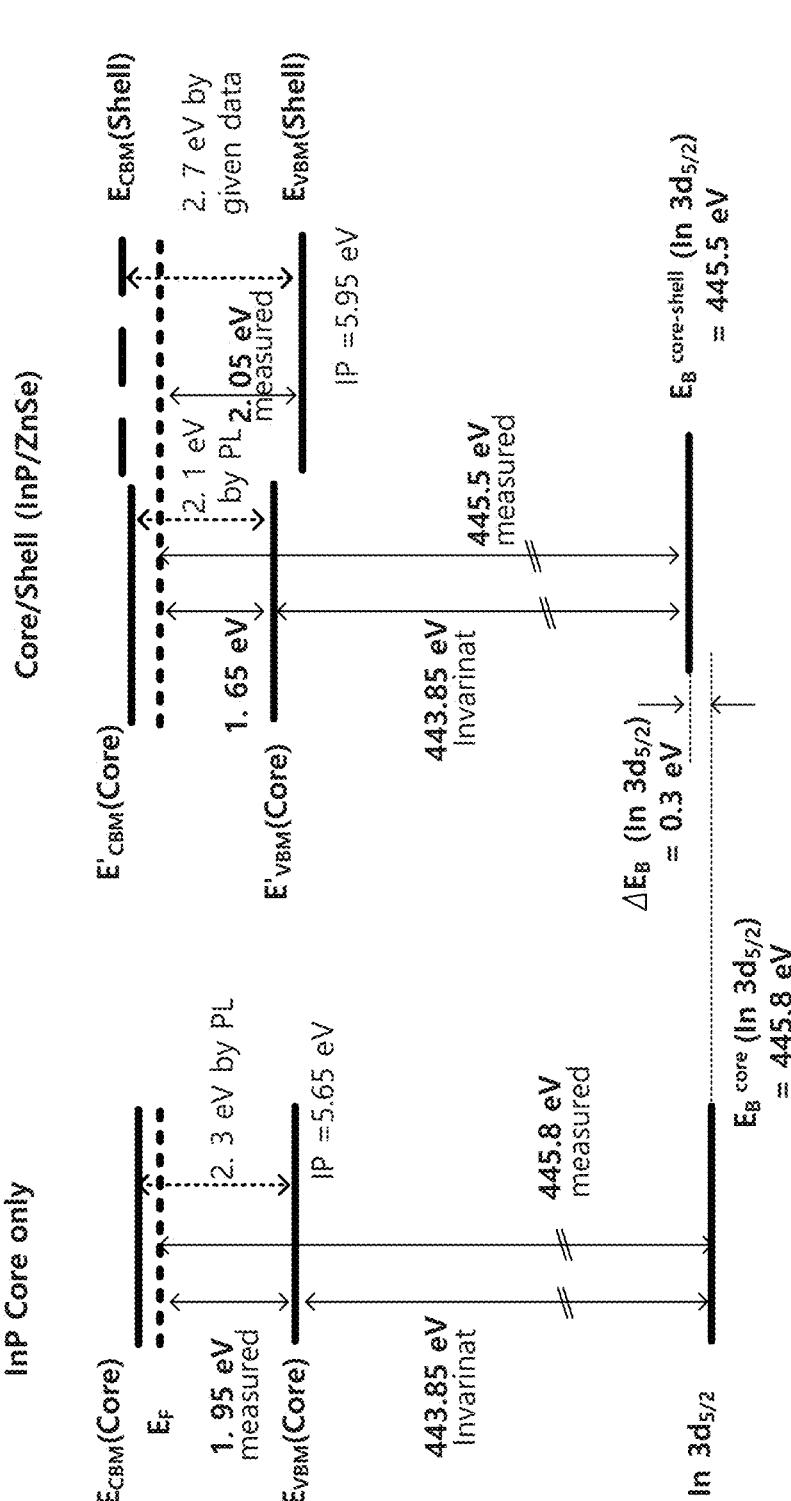
FIG. 6 is a diagram illustrating an energy level of an InP core nanoparticle and an energy level of a core/shell (InP/ZnSe) nanoparticle.

FIG. 6 is a diagram illustrating an energy level of an InP core nanoparticle and an energy level of a core/shell (InP/ZnSe) nanoparticle.

Figure 7:
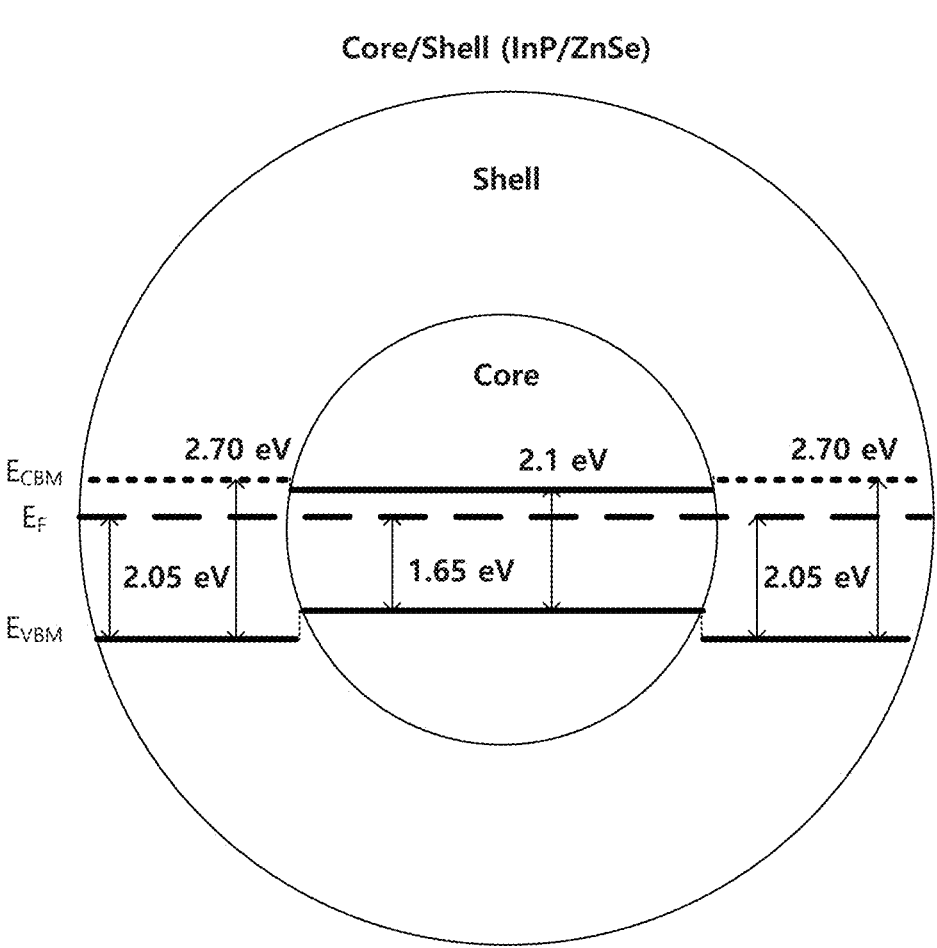
FIG. 7 is a diagram illustrating an energy level of a core/shell (InP/ZnSe) nanoparticle.

FIG. 7 is a diagram illustrating an energy level of a core/shell (InP/ZnSe) nanoparticle.

Referring to FIGS. 6 and 7, In $3d_{5/2}$ which is a core-level was 445.8 eV in a core nanoparticle and 445.5 eV in a core/shell nanoparticle. Thus, energy shift $\Delta E_B(\text{In}3d_{5/2})$ of 0.3 eV occurred Accordingly, all energy levels of the nanoparticle having the core/shell (InP/ZnSe) structure may be determined.

As described above, a method for characterizing an energy level of a nanoparticle having a core/shell structure according to an example embodiment may determine both a valence band energy level and a conduction band energy level of a core and a valence band energy level and a conduction band energy level of a shell. Accordingly, the energy levels of the core and the shell may be provided to promote development of materials having desired physical properties when preparing a nanoparticle having a core/shell structure used in a light emitting device, or the like.

Although the present disclosure and its advantages have been described in detail, it should be understood that various changes, substitutions and alterations can be made herein without departing from the spirit and scope of the disclosure as defined by the following claims.

What is claimed is:

1. A method for characterizing an energy level of a core/shell nanoparticle including a core and a shell surrounding the core, the method comprising:

measuring a core-level binding energy $E_B^{Core}$(core-level) and a valence band maximum energy $E_{VBM}$(core) of a core in a core nanoparticle having only the core using photoelectron spectroscopy;

measuring a core-level binding energy $E_B^{Core-Shell}$(core-level) of the core in the core/shell nanoparticle and a valence band maximum energy $E_{VBM}$(shell) of the shell in the core/shell nanoparticle using photoelectron spectroscopy; and calculating a valence band maximum energy $E'_{VBM}$(core) of a material forming the core in the core/shell nanoparticle, wherein the valence band maximum energy $E'_{VBM}$(core) of the material forming the core in the core/shell nanoparticle is given as follows:

$$E'_{VBM}(\text{core}) = E_{VBM}(\text{core}) + E_B^{Core-Shell}(\text{core–level}) - E_B^{Core}(\text{core–level}).$$

2. The method as set forth in claim 1, wherein the core is InP, the shell is ZnSe, and the core-level is $3d_{5/2}$ of In.

3. The method as set forth in claim 1, further comprising:

calculating a conduction band minimum energy $E'_{CBM}$(core) of the core in the core/shell nanoparticle, wherein a core energy bandgap BG(core) in the core/shell nanoparticle is measured using photoluminescence spectroscopy, wherein the core energy bandgap BG (core) is a difference between the conduction band minimum energy $E'_{CBM}$(core) of the core and valence band maximum energy $E'_{VBM}$(core) in the core/shell nanoparticle, and wherein the conduction band minimum energy $E'_{CBM}$(core) of the core in the core/shell nanoparticle is given as follows:

$$E'_{CBM}(\text{core}) = E'_{VBM}(\text{core}) + BG(\text{core}).$$

4. The method as set forth in claim 1, further comprising:

calculating conduction band minimum energy $E_{CBM}$(shell) of the shell in the core/shell nanoparticle, wherein the conduction band minimum energy $E_{CBM}$(shell) of the shell is given as follows:

$$E_{CBM}(\text{shell}) = E_{VBM}(\text{shell}) + BG(\text{shell}), \text{ and}$$

wherein a shell energy bandgap BG(shell), which is a difference between the conduction band minimum energy $E_{CBM}$(shell) and the valence band maximum energy $E_{VBM}$(shell) of the shell in the core/shell nanoparticle, is a value measured in a bulk state.

5. The method as set forth in claim 1, wherein core-level binding energies $E_B^{Core}$(core) and $E_B^{Core-Shell}$(core-level) are measured using X-ray, and wherein valence band maximum energies $E_{VBM}$(core) and $E_{VBM}$(Shell) are measured using ultraviolet (UV) light or X-ray.

6. The method as set forth in claim 1, wherein the core in each of the core nanoparticle and the core/shell nanoparticle is a first II-VI, IV-VI, or III-V semiconductor, and the shell is a second II-VI, IV-VI, or III-V semiconductor different from the first II-VI, IV-VI, or III-V semiconductor.

7. The method as set forth in claim 6, wherein the first II-VI, IV-VI, or III-V semiconductor is InP.

8. The method as set forth in claim 1, wherein the photoelectron spectroscopy when measuring each of the core-level binding energy $E_B^{Core}$(core-level) of the core in the core nanoparticle and the core-level binding energy $E_B^{Core-Shell}$(core-level) of the core in the core/shell nanoparticle comprises X-ray photoelectron spectroscopy.

* * * * *